(12) United States Patent
Müller

(10) Patent No.: US 6,545,927 B2
(45) Date of Patent: Apr. 8, 2003

(54) INTEGRATED SEMICONDUCTOR CIRCUIT, IN PARTICULAR A SEMICONDUCTOR MEMORY CONFIGURATION, AND METHOD FOR ITS OPERATION

(75) Inventor: Jochen Müller, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/833,008

(22) Filed: Apr. 11, 2001

(65) Prior Publication Data

US 2001/0035536 A1 Nov. 1, 2001

(30) Foreign Application Priority Data

Apr. 11, 2000 (DE) .......................................... 100 18 013

(51) Int. Cl.[7] ................................................. G11C 7/00
(52) U.S. Cl. ..................................... 365/225.7; 365/201
(58) Field of Search .............................. 365/201, 225.7; 326/37, 38, 39, 40; 327/409, 525, 526

(56) References Cited

U.S. PATENT DOCUMENTS

| | | | | |
|---|---|---|---|---|
| 5,412,593 A | * | 5/1995 | Magel et al. | ................. 365/96 |
| 5,657,280 A | * | 8/1997 | Shin et al. | ................. 365/200 |
| 5,901,094 A | * | 5/1999 | Chin et al. | ................. 365/200 |
| 5,926,034 A | * | 7/1999 | Seyyedy | ................. 326/37 |
| 6,229,378 B1 | * | 5/2001 | Gourley et al. | ............. 327/525 |
| 6,242,943 B1 | * | 6/2001 | El-Ayat | ................. 326/39 |
| 6,281,709 B1 | * | 8/2001 | Seyydy | ................. 326/87 |

* cited by examiner

*Primary Examiner*—David Nelms
*Assistant Examiner*—Gene N. Auduong
(74) *Attorney, Agent, or Firm*—Laurence A. Greenberg; Werner H. Stemer; Gregory L. Mayback

(57) ABSTRACT

An integrated semiconductor circuit, in particular a semiconductor memory configuration, which can be operated in various operating modes and which has an apparatus for switching between these operating modes is described. The semiconductor circuit has a switching apparatus with at least one fuse unit, which can be blown and programmed from the exterior.

16 Claims, 2 Drawing Sheets

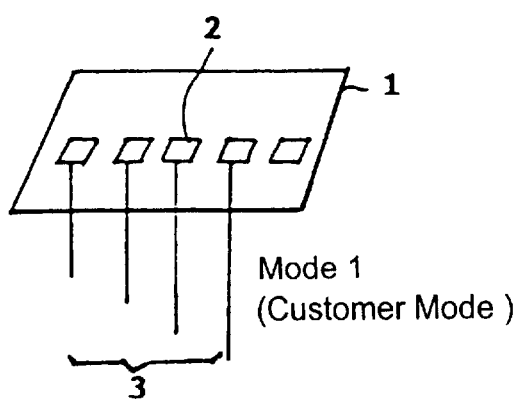
Fig. 1A Prior Art
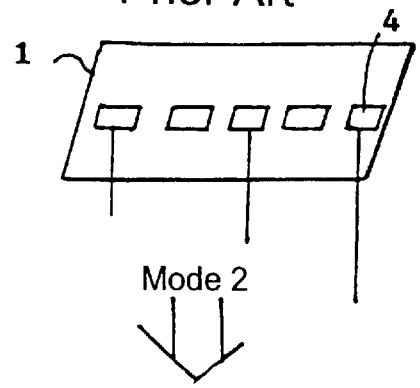
Fig. 1B Prior Art
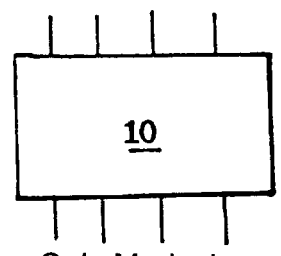
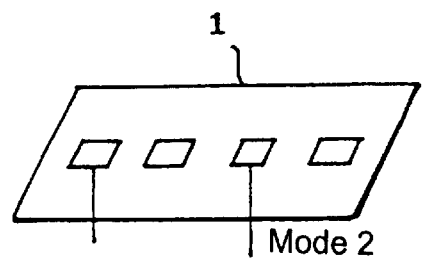
Fig. 1C Prior Art
Fig. 2A
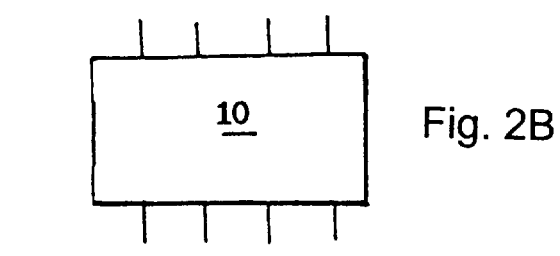
Fig. 2B

INTEGRATED SEMICONDUCTOR CIRCUIT, IN PARTICULAR A SEMICONDUCTOR MEMORY CONFIGURATION, AND METHOD FOR ITS OPERATION

BACKGROUND OF THE INVENTION

1. Field of the Invention

The present invention relates to an integrated semiconductor circuit, in particular a semiconductor memory configuration, which can be operated in various operating modes and which, for this purpose, has an apparatus for switching between the operating modes, and to a method for operation of an integrated semiconductor memory configuration.

In general, integrated semiconductor circuits, in particular integrated semiconductor memory configurations, are provided with one or more additional pads in order to make it possible to change reliably between the different operating modes or test modes at the wafer level. If such an additional pad is then externally raised to a predetermined voltage value, then the integrated semiconductor circuit changes to a different operating mode. X pads make it possible to change between $2^x$ modes.

For example, in the case of the integrated semiconductor memory configuration, the term "various operating modes" refers to a "normal" operating mode, as is also used by the user, and to other operating modes other than the normal mode. In which, for example, the functionality of the interface is changed, together with modes which change the conditions in which the memory chip is operated, and which are generally referred to as test modes. Such different modes are, for example, "RAMBUS", the normal operating mode, the DA MODE, and the drowsy mode.

A chip at the wafer level has various pads and associated contactors. Where no contact is made with the corresponding pads, the chip is in a customer mode which, by way of example, is referred to here as a first mode or mode one.

The chip can be changed to a second mode (i.e. mode two) by actuation of the mode pad. After being packaged, when the chip is then in the form of a module, only the first mode (one) is possible.

The need for such an additional mode pad can arise when it is intended to operate a memory chip at the wafer level with a different interface functionality, with contactors which differ for different functionalities of the interface, generally needle boards, being used for the modes. If one of the needle boards now does not make contact with all the pads which are necessary to change the chip to the other mode by externally applying a combination of signals to the pads, then this can nevertheless be achieved by raising the additional pad to the appropriate voltage.

Such an additional pad is not connected to the package contacts in the chip. This avoids a user inadvertently changing to a different operating mode.

SUMMARY OF THE INVENTION

It is accordingly an object of the invention to provide an integrated semiconductor circuit, in particular a semiconductor memory configuration, and a method for its operation which overcome the above-mentioned disadvantages of the prior art devices and methods of this general type, in which an additional pad or the additional pads in an integrated semiconductor circuit are avoided, and to allow reliable switching between various operating or test modes in such integrated semiconductor circuits.

With the foregoing and other objects in view there is provided, in accordance with the invention, an integrated semiconductor circuit. The circuit contains a switching apparatus for switching between various operating modes. The switching apparatus has at least one fuse unit able to be blown when the integrated semiconductor circuit is in a packaged state. The fuse unit can be programmed by fuse soft set programming and can be blown at a wafer level, and a blown state of the fuse unit being bridged by the fuse soft set programming of the fuse unit.

According to one major aspect of the invention, the integrated semiconductor circuit, in particular a semiconductor memory configuration, which achieves the above object and can be operated in various operating modes has an apparatus for switching between the operating modes. The switching apparatus has at least one fuse unit that can be blown when the semiconductor circuit is in the packaged state, and is characterized in that the fuse unit is a fuse unit which can be programmed by a "fuse soft set", can also be blown at the wafer level of the integrated semiconductor circuit, and in which the blown state can be bridged by a programmed fuse soft set.

The use of the programmable operating mode fuse results in that there is no longer any need to provide an additional pad for changing between the various operating modes. The operating mode fuse is blown, that is to say it is disconnected, in order to change the chip to the normal operating mode before encapsulation in a package.

Since the operating mode fuse can also be programmed ("fuse soft set"), it is also possible to change between the modes in the packaged module.

Normally, the information in the fuse (blown or disconnected or not) is read only once after the external supply voltage has been raised, so that the memory chip remains in the respectively set operating mode for as long the external voltage is applied. In order, for example, that the chip can be measured using a needle board even immediately after production but before blowing of a fuse unit, with the needle board being based on the functionality of the interface for the operating mode other than the normal mode, the operating mode selection circuit, which is connected to the switching apparatus and decides the operating mode that the chip will be in once the supply voltage has been raised, can automatically select the operating mode other than the normal mode. The selection of the operating mode after the supply voltage has been raised, can be, but need not necessarily, be linked to the programmable fuse unit.

In accordance with an added feature of the invention, the switching apparatus is configured such that, in response to the fuse soft set programming of the fuse unit without the fuse unit being blown, the switching apparatus sets an operating mode corresponding to the blown state of the fuse unit.

In accordance with another mode of the invention, the switching apparatus is configured such that, in response to the fuse unit being blown before the integrated semiconductor circuit is packaged in a package, the integrated semiconductor circuit changes to the normal operating mode.

In accordance with an additional mode of the invention, the switching apparatus is configured such that, in the packaged state, the integrated semiconductor circuit can change between the various operating modes, even when the fuse unit is in the blown state, by the fuse soft set programming of the fuse unit.

In accordance with a further feature of the invention, the switching apparatus is configured such that, at the wafer level and immediately after production when a supply voltage is raised, the switching apparatus automatically sets the integrated semiconductor circuit to an operating mode other than the normal operating mode.

In accordance with a further added feature of the invention, the switching apparatus selects the operating mode other than the normal operating mode by the fuse soft set programming of the fuse unit.

In accordance with a further additional feature of the invention, the switching apparatus selects the operating mode other than the normal operating mode without the fuse soft set programming of the fuse unit.

In accordance with another further feature of the invention, the fuse unit is configured for storing and for reading its information.

In accordance with a concomitant feature of the invention, the integrated semiconductor circuit is a semiconductor memory configuration.

With the foregoing and other objects in view there is also provided, in accordance with the invention, a method for operation of an integrated semiconductor memory configuration. The method includes using a switching apparatus having at least one fuse unit able to be blown and able to be programmed by fuse soft set programming. The switching apparatus is used for selecting between different operating modes. The fuse unit is blown at a wafer level and, in response to the fuse unit being blown, the integrated semiconductor memory operates in a normal operating mode.

In accordance with an added mode of the invention, there is the step of automatically switching to an operating mode other than the normal operating mode immediately after production and when a supply voltage is raised.

In accordance with an additional mode of the invention, there is the step of storing and reading back information in the fuse unit immediately after a power-up condition is detected.

In accordance with a further mode of the invention, there is the step of carrying out a front end test when the fuse unit is in an unblown state.

Other features which are considered as characteristic for the invention are set forth in the appended claims.

Although the invention is illustrated and described herein as embodied in an integrated semiconductor circuit, in particular a semiconductor memory configuration, and a method for its operation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1a is a block diagram of a chip according to the prior art;

FIG. 1b is a block diagram of the chip;

FIG. 1c is a block diagram of the chip;

FIG. 2a is a block diagram of the chip according to the invention;

FIG. 2b is a block diagram of the chip; and

DESCRIPTION OF THE PREFERRED EMBODIMENT

Figure 3:
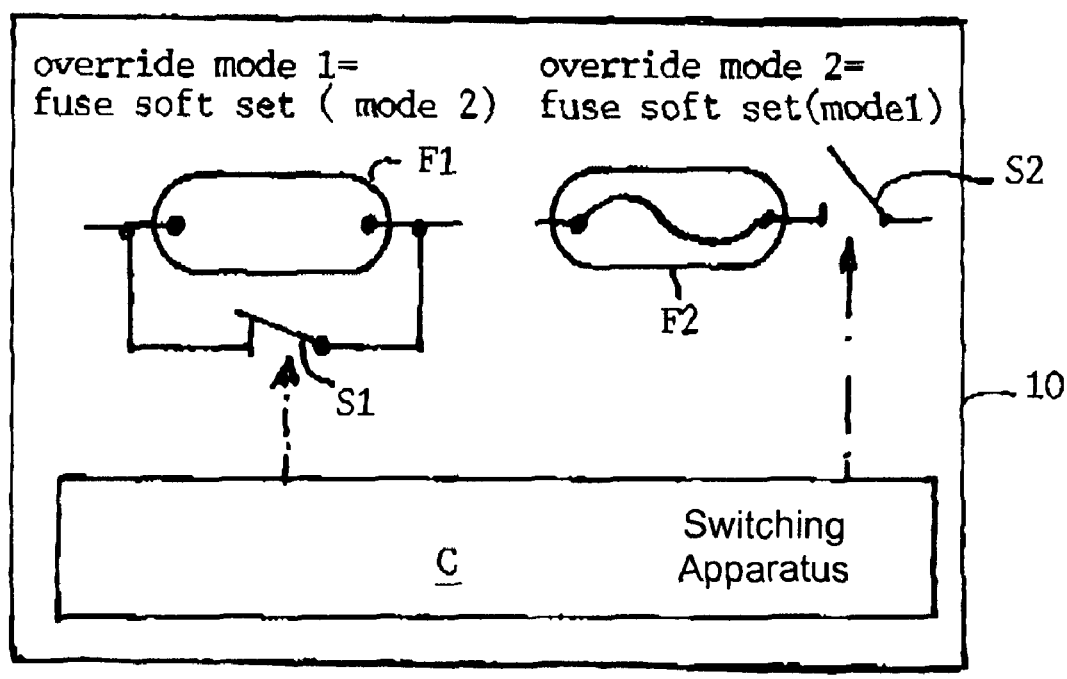
FIG. 3 is a block diagram of an electromechanical equivalent of a mode fuse, a state of the mode fuse can be overridden by a programmable fuse soft set by a switching apparatus.

In all the figures of the drawing, sub-features and integral parts that correspond to one another bear the same reference symbol in each case. Referring now to the figures of the drawing in detail and first, particularly, to FIG. 1a thereof, there is shown schematically a chip 1 at a wafer level with various pads 2 and associated contactors 3. Where no contact is made with the corresponding pads 2, the chip 1 is in a customer mode which, by way of example, is referred to here as a first mode or mode one.

In FIG. 1b, the chip 1 has been changed to a second mode or mode two by actuation of a mode pad 4. After being packaged, the chip 1 is then in the form of a module 10 as shown in FIG. 1c, where only mode one is possible.

FIG. 2a shows, likewise schematically the invention of the application, where one option for switching between different modes without there being a mode pad. In FIG. 2a, where the chip 1 is at the wafer level, an operating mode other than the normal mode, for example mode two, can be selected, for example, by actuating appropriate contactors, that is to say the needle boards. In FIG. 2b, where the chip is in the packaged state, that is to say in the form of the module 10, a mode fuse has been blown (fuse blow mode) before being packaged, so that the module 10 is then operated in the normal mode, for example mode one.

However, the configuration according to the invention also makes it possible to change between mode one and mode two in the packaged state, by a fuse soft set. This also obviously applies to the wafer level of the chip 1, shown in FIG. 2a.

An exemplary embodiment of a method for operation of an integrated semiconductor memory configuration, using the fuse unit or units according to the invention, is described in the following text with reference to FIGS. 2a and 2b.

In this case, it is assumed that the chip 1 is being operated at the wafer level with an interface functionality other than the normal operating mode as is also used by the user. This is referred to as the "changed operating mode" (for example mode two). In this case, various contactors, in general needle boards, can be used for the modes with different interface functionalities. This may be of interest, for example, for double data rate (DDR) chips, which are operated in the single data mode at wafer level in order to avoid the high operating frequency for DDR, for self-test solutions which are fitted on the chip in order to test the chip using low-cost test equipment, for RAMBUS which is tested in the DA mode at the wafer level, generally for performance reasons, in order to test a very fast semiconductor memory at low speed at the wafer level.

After detection of the applied supply voltage (internal voltage signal active), the latches of the fuse units are read for redundancy and other functions which are controlled via the fuse units. The fuse unit according to the invention is additional to the fuse units and decides whether the chip 1 is in the normal operating mode or in the changed operating mode. When the fuse unit is in the unblown state (default state), the chip assumes the changed mode (for example mode two). The wafer (FIG. 2a) can thus be tested directly using the changed needle board in the front end without any additional external signal having to be applied. After the front end test, the operating mode fuse unit is blown (fuse blow mode), and the packaged chip 10 can then be operated in the normal mode (for example mode one).

If it is also intended to operate the chip 1 in the normal mode at the wafer level for analysis purposes, it can be changed to the normal operating mode by programmed setting of the fuse unit, without any need to blow the fuse unit.

Conversely, once the fuse unit has been blown (disconnected), it is still possible to change back to the changed operating mode (i.e. mode two) from the normal mode (i.e. mode one) by programmed actuation of the fuse unit (fuse soft set).

FIG. 3 schematically shows an electromechanical equivalent circuit of a programmable fuse soft set carried out by switching apparatus C included in the chip 10. The right-hand side of FIG. 3 shows a mode fuse F2 representing mode two which can be overridden by fuse soft set programming to attain mode one. Overriding is represented by opened switch S2 serially coupled to the fuse F2 carried out by the switching apparatus C. Programmably closing switch S2 again achieves mode two with the unblown fuse F2. The left-hand side of FIG. 3 shows a state when a mode fuse F1 has been blown representing for example mode one. Mode one is overridden by fuse soft set programming to achieve mode two in that a switch S1 which is shown parallel to mode fuse F1 is closed by the switching apparatus C (i.e. fuse soft set programming).

It is clear to one skilled in the art that the switches S1 and S2 are only schematically represented by mechanical switches and may be implemented, for example, by mode latches, transfer gates, logic gates, and the like associated to the respective mode fuse.

The use of the programmable operating mode fuse unit proposed according to the invention results in that there is no need for the disadvantageous additional pad, which is known from the prior art, for changing between the various operating modes.

I claim:

1. An integrated semiconductor circuit, comprising:
   a switching apparatus for switching between various operating modes, said switching apparatus having at least one fuse unit to be programmed by fuse soft set programming and able to be blown and bridged by the fuse soft set programming using reversible software without using non-reversible hardware.

2. The integrated semiconductor circuit according to claim 1, wherein said switching apparatus is configured such that, in response to the fuse soft set programming of said fuse unit without said fuse unit being blown, said switching apparatus sets an operating mode corresponding to the blown state of said fuse unit.

3. The integrated semiconductor circuit according to claim 1, wherein said switching apparatus is configured such that, in response to said fuse unit being blown before the integrated semiconductor circuit is packaged in a package, the integrated semiconductor circuit changes to a normal operating mode.

4. The integrated semiconductor circuit according to claim 1, wherein said switching apparatus is configured such that, in the packaged state, the integrated semiconductor circuit can change between the various operating modes, even when said fuse unit is in the blown state, by the fuse soft set programming of said fuse unit.

5. The integrated semiconductor circuit according to claim 1, wherein said switching apparatus is configured such that, at the wafer level and immediately after production when a supply voltage is raised, said switching apparatus automatically sets the integrated semiconductor circuit to an operating mode other than a normal operating mode.

6. The integrated semiconductor circuit according to claim 5, wherein said switching apparatus selects the operating mode other than the normal operating mode by the fuse soft set programming of said fuse unit.

7. The integrated semiconductor circuit according to claim 5, wherein said switching apparatus selects the operating mode other than the normal operating mode without the fuse soft set programming of said fuse unit.

8. The integrated semiconductor circuit according to claim 1, wherein said fuse unit is configured for storing and for reading its information.

9. The integrated semiconductor circuit according to claim 1, wherein the integrated semiconductor circuit is a semiconductor memory configuration.

10. The integrated semiconductor circuit according to claim 1, wherein said fuse unit is to be blown and bridged when the integrated semiconductor circuit is in a packaged state or at a wafer level.

11. A method for operation of an integrated semiconductor memory configuration, which comprises the steps of:
   providing a switching apparatus having at least one fuse unit to be programmed by fuse soft set programming and to be blown and bridged by the fuse soft set programming of the fuse unit using reversible software without using non-reversible hardware, and using the switching apparatus for selecting between different operating modes; and
   blowing the fuse unit and, in response to the fuse unit being blown, operating the integrated semiconductor memory in a normal operating mode.

12. The method according to claim 11, which comprises automatically switching to an operating mode other than the normal operating mode immediately after production and when a supply voltage is raised.

13. The method according to claim 12, which comprises storing and reading back information in the fuse unit immediately after a power-up condition is detected.

14. The method according to claim 11, which comprises carrying out a front end test when the fuse unit is in an unblown state.

15. The method according to claim 11, wherein the step of blowing or bridging the fuse unit can be carried out when the integrated semiconductor circuit is in a packaged state or at a wafer level.

16. An integrated semiconductor circuit, comprising:
   a switching apparatus for switching between various operating modes, said switching apparatus having at least one fuse unit being programmable by fuse set software programming to override a blown state and a non-blown state of said fuse for a principally indefinite number of times.

* * * * *